United States Patent
Otremba

(10) Patent No.: US 7,737,551 B2
(45) Date of Patent: Jun. 15, 2010

(54) SEMICONDUCTOR POWER MODULE WITH SiC POWER DIODES AND METHOD FOR ITS PRODUCTION

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 834 days.

(21) Appl. No.: 11/428,479

(22) Filed: Jul. 3, 2006

(65) Prior Publication Data

US 2007/0013059 A1    Jan. 18, 2007

(30) Foreign Application Priority Data

Jul. 6, 2005    (DE) .................. 10 2005 031 836

(51) Int. Cl.
*H01L 23/34*    (2006.01)
(52) U.S. Cl. .................. 257/724; 257/177; 257/723; 257/728; 257/E23.044
(58) Field of Classification Search ............. 257/723, 257/724, E23.044, 177, 728
See application file for complete search history.

(56) References Cited

U.S. PATENT DOCUMENTS

| | | | | |
|---|---|---|---|---|
| 4,314,270 A | * | 2/1982 | Iwatani ................. | 257/708 |
| 4,875,618 A | | 10/1989 | Hasegawa et al. ........... | 228/179 |
| 5,001,299 A | * | 3/1991 | Hingorany ................. | 174/521 |
| 5,221,851 A | | 6/1993 | Gobrecht et al. ........... | 257/177 |
| 5,897,048 A | | 4/1999 | Cheng et al. ............. | 228/180.5 |
| 5,901,901 A | * | 5/1999 | Schneegans et al. ........ | 228/254 |
| 6,166,937 A | * | 12/2000 | Yamamura et al. .......... | 363/141 |
| 6,269,014 B1 | * | 7/2001 | Sander et al. ............... | 363/132 |
| 2003/0102489 A1 | * | 6/2003 | Nam et al. ................. | 257/177 |
| 2004/0188706 A1 | * | 9/2004 | Chang et al. ............... | 257/177 |
| 2005/0056918 A1 | * | 3/2005 | Jeun et al. .................. | 257/678 |

FOREIGN PATENT DOCUMENTS

| | | |
|---|---|---|
| DE | 19606101 A1 | 2/1996 |
| DE | 19935100 A1 | 7/1999 |
| DE | 10124141 A1 | 5/2001 |
| EP | 0265927 B1 | 10/1987 |
| EP | 0499707 B1 | 12/1991 |
| JP | 010483438 A | 8/1987 |
| JP | 2005005593 A | 6/2003 |

* cited by examiner

*Primary Examiner*—Eugene Lee
*Assistant Examiner*—Peniel M Gumedzoe
(74) *Attorney, Agent, or Firm*—Banner & Witcoff, Ltd.

(57) ABSTRACT

A semiconductor power module has at least one power semiconductor chip (2) which can be controlled by the field effect and has a plurality of fail-safe, small-area SiC power diodes ($D_1$ to $D_8$). The function of a large-area SiC power diode chip which is susceptible to failure is distributed over these small-area, parallel-connected SiC power diode chips ($D_1$ to $D_8$) in such a way that their total area of active SiC diode areas ($F_1$ to $F_8$) corresponds to an area extent of a large-area non-fail-safe SiC power diode chip.

10 Claims, 2 Drawing Sheets

SEMICONDUCTOR POWER MODULE WITH SIC POWER DIODES AND METHOD FOR ITS PRODUCTION

CROSS-REFERENCE TO RELATED APPLICATIONS

This application claims priority to German application number 10 2005 031 836.3 filed Jul. 6, 2005, the contents of which is hereby incorporated by reference in its entirety.

TECHNICAL FIELD

The invention relates to a semiconductor power module having at least one power semiconductor chip which can be controlled by the field effect. These sensitive power semiconductor chips must be protected against overvoltages by means of high-power diodes. In some cases, high-power diodes are also required in a module such as this in order to supply currents in appropriate directions to the power semiconductor chips which can be controlled by the field effect.

BACKGROUND

Power diodes based on monocrystalline silicon crystals allow only a limited current load. The temperature resistance of silicon diodes is restricted, and the function of a silicon power diode changes to a permanently connected resistance at temperatures above 200° C. Since the heat dissipation measures for semiconductor power modules cannot be improved indefinitely, there is a need to increasingly replace silicon power diodes by high-temperature-resistant SiC power diodes in semiconductor power modules.

In order to increase the current-carrying capacity of SiC power diodes such as this, it is necessary to enlarge the chip areas of the corresponding semiconductor power components. However, with enlargement of the chip areas, particularly in the case of SiC crystals, the respective defect density leads to a reduced yield and thus to a higher failure rate for large-area, SiC-based power semiconductor components. By way of example, the yield of SiC monocrystalline pieces falls from 89% for a chip area of 1 mm² to 62% when the semiconductor chip area is tripled. This is associated with the disadvantage that large-area SiC power diode chips are subject to a failure risk which is more than 10% greater.

A further disadvantage of conventional power semiconductor modules is that the power semiconductor chips and the SiC power diodes are eutectically soldered by their rear-face metallization to corresponding metal layers on a power semiconductor component housing. At the high permissible operating temperatures of SiC diodes, there is a risk of eutectic soldered joints such as these on the rear faces of the SiC diodes melting once again, so that it is not possible to guarantee the reliability of high-power components such as these.

Furthermore, the eutectic melt requires a melt pool or melt area on the metal coating of the power semiconductor component housing which is larger than the rear face, to be applied to the metal coating, of the respective power semiconductor component. This has the disadvantage that considerably larger areas must be provided for the metal layer than the total area of the rear faces of the semiconductor power chip to be arranged in a semiconductor power module.

SUMMARY

A semiconductor power module may have at least one power semiconductor chip which can be controlled by the field effect and which furthermore has a current-carrying capacity which corresponds to that of a large-area SiC power diode chip which is, however, susceptible to failure.

The semiconductor power module having at least one power semiconductor chip which can be controlled by the field effect may be provided, with a plurality of fail-safe, small-area SiC power diodes carrying out the task and function of a large-area SiC power diode chip which is susceptible to failure. For this purpose, the function of a large-area SiC power diode chip which is susceptible to failure is distributed over these small-area, parallel-connected SiC power diode chips in such a way that their total area of active SiC diode areas corresponds to an area extent of a large-area non-fail-safe SiC power chip.

BRIEF DESCRIPTION OF THE DRAWINGS

The invention will now be explained in more detail with reference to the attached figures, in which.

DETAILED DESCRIPTION

Figure 1:
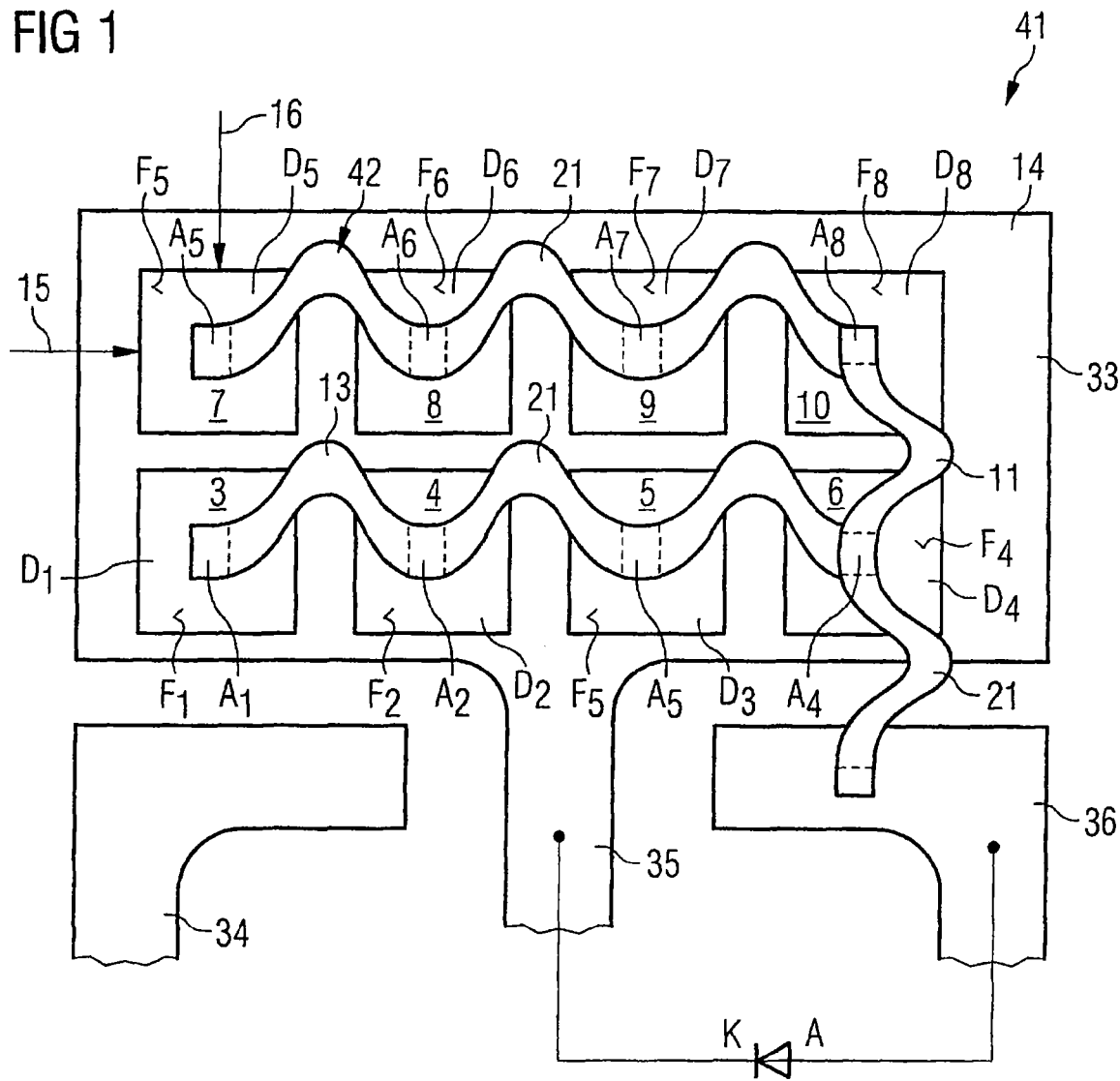
FIG. 1 shows a schematic plan view of a detail of a semiconductor power module with a first embodiment of small-area, fail-safe SiC power diodes connected in parallel.

A semiconductor power module such as this has the advantage that the yield of functioning semiconductor power modules can be drastically increased. At the same time, the problem of increasing the current-carrying capacity for a semiconductor power module such as this is solved without any risk of more than a third, that is to say more than 33%, of the semiconductor power modules failing after completion. In fact, the yield can be increased by more than 10% by the incorporation of a plurality of fail-safe, small-area SiC power diodes. The fitting of a plurality of small-area SiC power diodes arranged in a matrix in a semiconductor power module housing allows the effective total chip area per semiconductor power module to be multiplied, without the need for reduction to a lower yield of large-area SiC monocrystals.

In one embodiment, the electrode upper faces of the small-area SiC power diodes are electrically connected to one another via looped-through bonding connections. A multi-stitch and wedge-to-wedge wire bonding technique is used for this parallel multichip wire bonding assembly. The looped-through bonding connections result in a higher manufacturing throughput, while at the same time halving the number of contact pads required on the SiC power diodes, so that large quantities of small-area SiC power diodes can be used within one semiconductor power module. Furthermore, the wedge-to-wedge wire bonding technique means that a contact pad such as this on the small-area SiC power diodes is used twice or three times, above bonding wires being bonded, stacked one on top of the other, on one contact pad of a small-area SiC power diode.

A further embodiment provides for the electrodes on the rear faces of the small-area SiC power diodes to be electrically connected to one another via a metallic layer, with the rear faces being electrically connected to the metallic layer via a diffusion solder. The advantage of integral electrical contact by means of a diffusion solder is on the one hand that the melt pool is not larger than the rear faces of the SiC power diodes with which contact is to be made, because there is no need to form a conventional melt pool as is normal for eutectic solder. In fact, diffusion soldering is based on solid-state diffusion, in which high concentrations of the metallic components involved in the diffusion solder layer are equalized out and form high-melting-point intermetallic phases whose melting point is higher than the temperature which is required for solid-state diffusion of the metal atoms.

A longer soldering time must admittedly be provided for diffusion soldering, but normal soldering processes can subsequently be carried out on the metal coating without the SiC diodes becoming detached from the substrate or the metal layer. The further advantage is that the high temperature resistance of the SiC diodes can also be exploited as a result of the higher temperature resistance of the diffusion solder layer. The maximum permissible current density through the SiC diodes can thus be increased by a multiple in comparison to silicon diodes. The use of a diffusion solder on the chip rear faces allows a compact semiconductor chip matrix on the chip mount, since no solder areas or melt pools occur around the semiconductor chips. Furthermore, the number of bonding wires required to make contact with the SiC power diode chips is reduced by the multistitch and wedge-to-wedge wire bonding process.

For this purpose, in one embodiment, the small-area, parallel-connected SiC power diode chips are arranged in rows and columns alongside one another, with one looped-through bonding wire in one row connecting the electrodes on the upper face of the SiC power diode chip in each case one row, and with a common looped-through bonding wire joining the wires of the rows together along a column and connecting them to a contact pad area, preferably of an inner flat conductor.

In addition to the already mentioned small-area SiC power diodes and the power semiconductor chip which can be controlled by the field effect, a preferred semiconductor power module has at least one further silicon-based semiconductor chip, which has an integrated control circuit. Semiconductor chips such as these are provided with an integrated circuit and coordinate the signal processing as well as the supply of the semiconductor chips assembled in the semiconductor chip module. This further semiconductor chip is preferably positioned on the active upper face of the silicon-based power semiconductor chip which can be controlled by means of the field effect. This has the advantage that it makes it possible to reduce the area for the semiconductor power module. Furthermore, a predetermined semiconductor power module housing area is optimally used since a semiconductor chip stack is now in practice provided within the semiconductor module.

The stacking of the further semiconductor chips on the power semiconductor chip which can be controlled by means of the field effect is advantageous in its own right because these further semiconductor chips have a smaller area extent than the power semiconductor chips which can be controlled by means of the field effect. It is thus also possible to provide relatively short wiring, at low cost, between the power semiconductor component chip and the further semiconductor chip. It is also advantageous for a temperature monitoring circuit for the power semiconductor chip arranged underneath to be integrated in the further semiconductor chip. A temperature monitoring circuit such as this ensures that the power semiconductor chip which is arranged underneath and can be controlled by the field effect is not heated to temperatures at which it would no longer operate.

The semiconductor components provided in the past and the bonding connections are preferably arranged in a metallic hollow housing as a semiconductor power component housing. Hollow housings such as these have the advantage that the surfaces of the semiconductor power chips are not packaged in thermally insulating materials. It is also possible to equip the bottom area of such hollow housings with a heat sink, or to connect this bottom area to a heat sink, thus ensuring a greater cooling capability and dissipation of the heat losses. The metallic hollow housings furthermore have the advantage that they are resistant to high temperatures. In addition to metallic hollow housings, it is also preferably possible to use ceramic hollow housings, which are likewise resistant to high temperatures.

Furthermore, it is possible to use a hollow housing as the semiconductor power component housing for the semiconductor power modules according to an embodiment, with the cavity being arranged in a plastic housing compound. In this case, a metallic bottom plate is preferably also provided, while metallic flat conductors project through the plastic housing frame into the cavity and form inner flat conductors, with these flat conductors at the same time projecting out of the hollow housing and being used as corresponding outer flat conductors. Hollow housings such as these which are provided with a plastic housing compound have the advantage that they can be manufactured at relatively low cost. The temperature resistance of this plastic housing compound can be further increased by filling it with ceramic particles up to 95% by weight.

A method for production of a semiconductor power module having at least one power semiconductor chip which can be controlled by the field effect and having a plurality of fail-safe, small-area SiC power diodes has the following method steps. First of all, a power semiconductor chip which can be controlled by the field effect is produced from a low-defect monocrystalline silicon wafer and, furthermore, fail-safe, small-area SiC-based power diode chips are produced from a high-defect monocrystalline SiC crystal. These small-area, fail-safe SiC power diode chips distribute the function of a large-area SiC power diode which is susceptible to failure over a plurality of small-area, parallel-connected SiC power diodes in such a manner that, in total, the small-area SiC power diode chips correspond to the area extent of the large-area SiC power diode.

Once a sufficient number of such small-area, fail-safe SiC power diodes has been produced, the small-area SiC power diode chips are first of all applied to a prepared metal layer of a semiconductor power component housing, by diffusion soldering. A drain connection of the power semiconductor chip is then applied to a further prepared metal layer, or else to the same prepared metal layer, without the problem of the small-area SiC power diodes becoming detached from the metal layer, by means of soldering the rear-face electrode of the power semiconductor chip onto the prepared metal layer. After the positioning of the various power semiconductor chips, the SiC power diode chips are bonded on their upper-face electrodes by bonding wires being looped through in rows. This process of looping through in rows is also referred to as the multistitch method. In addition, at least one further bonding wire is applied to existing bonding contacts by means of looping through, transversely with respect to the rows. This process of looping through from one bonding wire connection to another is also referred to as the wedge-to-wedge method.

Finally, the semiconductor power component housing is closed with the aid of a self-supporting cover. This method has the advantage that it is suitable for mass production. Furthermore, it has the advantage that, during diffusion soldering of the SiC power diodes, the diffusion solder is also converted to a higher-melting-point compound during the semiconductor chip mounting process, so that the diffusion solder no longer melts during the subsequent semiconductor chip mounting processes. In addition, the use of the diffusion soldering process makes it possible to increase the maximum chip size, since the solder area or solder pool which normally occurs with eutectic solder is avoided and, instead of this, only the chip area is required for the diffusion soldering. In addition, the method simplifies mass production, since the number of bonding wires which are required by making contact with the front face of the chip is reduced by the use of the multistitch and wedge-to-wedge wire bonding process.

For this purpose, the small-area SiC power diode chips are applied by diffusion soldering to a prepared common metal layer of a power component housing, with the SiC power diodes being arranged in rows and columns.

Furthermore, the bonding process is carried out by bonding wires being looped through in rows on the upper-face electrodes of the SiC power diodes, by the bonding wire not being cut after connection of two bonding points but being looped through to the next bonding point, until all of the bonding points on the upper faces of the SiC power diodes in one row have been connected to one another.

Furthermore, the application and looping through of at least one bonding wire transversely with respect to the rows on existing bonding wire contacts to a contact pad of an inner flat conductor is carried out by bonding a further bonding wire onto the existing bonding wire, onto a bonding wire which has already been bonded at a bonding point. The semiconductor component housing is preferably closed with the aid of a self-supporting cover, by soldering or adhesively bonding the cover on, as an integral joint.

Metallic or ceramic hollow housings composed of a plastic frame may be used as semiconductor power component housings, in which case a metallic bottom and a metallic cover can be inserted into the plastic frame.

FIG. 1 shows a schematic plan view of a detail 41 of a semiconductor power module with a first embodiment of small-area, fail-safe SiC power diodes $D_1$ to $D_8$ connected in parallel 42. These small-area SiC power diodes $D_1$ to $D_8$ have SiC diode areas $F_1$ to $F_8$, in which case the sum of the diode areas corresponds to a flat extent of one large-area SiC power diode. However, the manufacturing yield resulting from the use of small-area, fail-safe SiC power diodes $D_1$ to $D_8$ is better by at least 10% than when using a large-area SiC power diode, which is susceptible to failure, with the same overall area extent. These SiC power diodes $D_1$ to $D_8$ each have only one respective electrode $A_1$ to $A_8$ on their upper faces 3 to 10, to which electrode a bonding wire 11, 12 and 13 is bonded. For this purpose, the small-area SiC power diodes $D_1$ to $D_8$ are soldered by their rear faces onto a metal plate 14, by means of diffusion solder.

In addition, this diffusion solder is also converted to a compound with a higher melting point during the chip mounting process, and thus no longer melts during the subsequent chip mounting processes for the other power semiconductor chips in a semiconductor power module. In addition, the use of the diffusion process makes it possible to achieve the maximum chip size and chip density on a metallic bottom plate 33 of a hollow housing, since there is no solder area as is otherwise standard with eutectic solder joints and, instead of this, this area can now be used as a chip area for the small-area SiC power diodes $D_1$ to $D_8$, so that the entire required upper face of the metal layer 14 on the bottom plate 33 does not occupy significantly more than the area required by one SiC power diode chip which has a large area but is not fail-safe.

The bonding wires 11, 12 and 13 produce a high-current bonding connection 21 by using an appropriately thick aluminum bonding wire for looping through the bonding connections. While two bonding wires 12 and 13 are required in this first embodiment for the two rows 15 of in each case four SiC power diodes, only one further looped-through bonding wire 11 is required in order to connect the two rows 15 to a metallic flat conductor 36. The metallic bottom plate 33 on which the rear faces of the small-area SiC power diodes $D_1$ to $D_8$ are diffusion-soldered merges into a flat conductor 35, which projects out of the cavity, which is not shown here, of a hollow housing. While the common anode A is connected to the metallic flat conductor 36, the common cathode K of the parallel-connected, small-area SiC power diodes $D_1$ to $D_8$ is arranged on the flat conductor 35. This embodiment of the bonding connections 11, 12 and 13 is also referred to as multistitch and wedge-to-wedge wire bonding.

Figure 2:
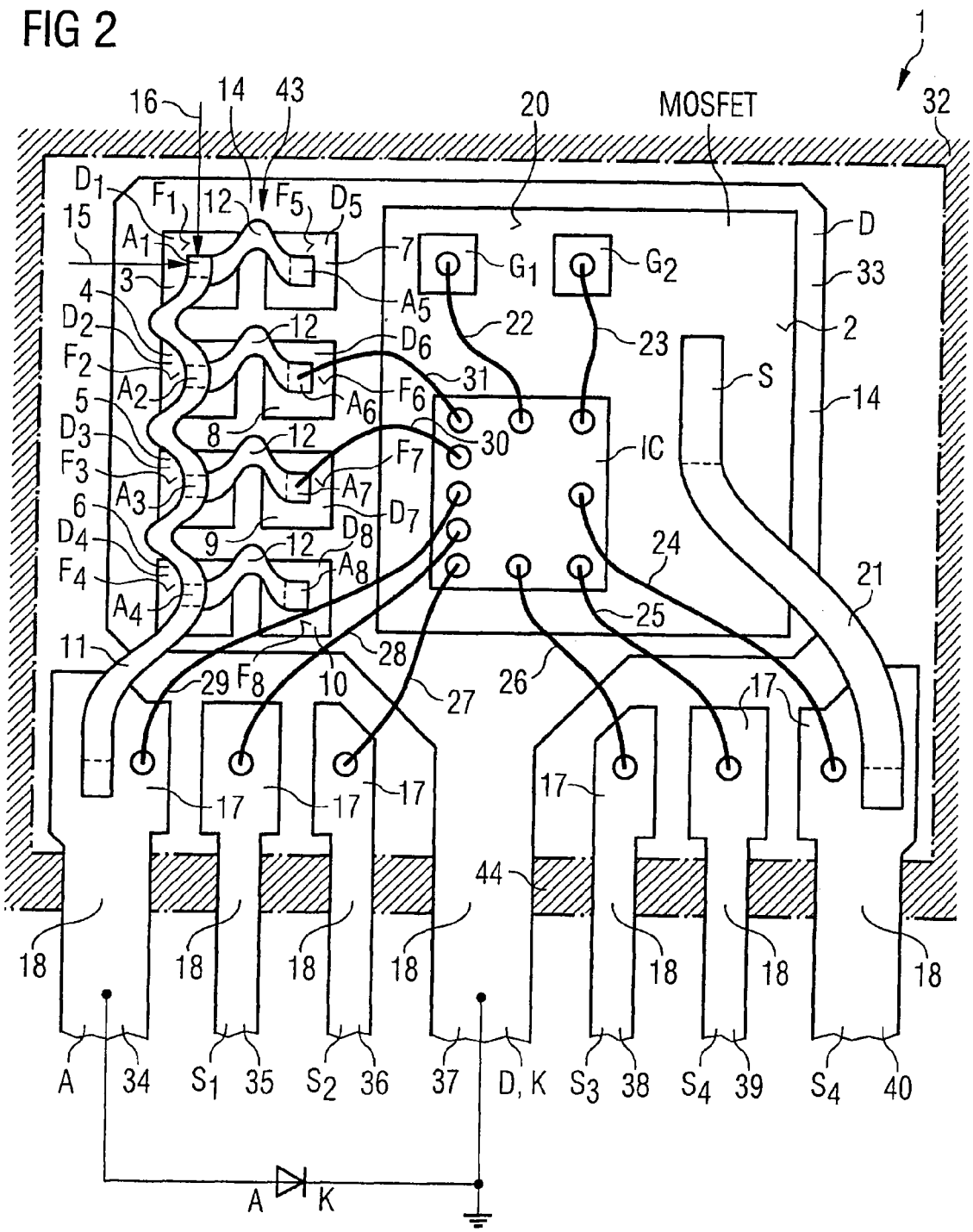
FIG. 2 shows a schematic plan view of a semiconductor power module with a second embodiment of fail-safe SiC power diodes connected in parallel.

FIG. 2 shows a schematic plan view of a semiconductor power module 1 with a second embodiment of fail-safe, small-area SiC power diodes $D_1$ to $D_8$ connected in parallel 43. In this embodiment of the invention, the semiconductor power module 1 has a hollow housing 32 which may be formed from ceramic, metal or plastic, with metallic flat conductors 34 to 40 passing through the housing frame 44 and having contact pad areas 17 of inner flat conductors 18 within the housing frame 44. The bottom plate 33 on which the power semiconductor chips 2 and $D_1$ to $D_8$ are mounted merges, in this embodiment of the invention, into an outer flat conductor 37, while the common anode A of the small-area SiC power diodes $D_1$ to $D_8$ is passed outwards to the outer flat conductor 34.

The parallel circuit 43 is thus located with its common cathode K on the outer flat conductor 37 and with its common anode A on the outer flat conductor 34. At the same time, a MOSFET power semiconductor chip 2 is fixed on the metallic bottom plate 33 of this hollow housing 32. The lower face of this MOSFET 2 has a drain contact D, which is electrically connected via the metallic bottom plate 33 to the common cathode K. A further semiconductor chip IC is arranged on the active upper face 20 of the MOSFET 2 and some of its contact pads 45 are connected to the gate electrodes $G_1$ and $G_2$ via bonding wires 22 and 23, and are connected via the bonding wires 25, 26, 27 and 28 to corresponding flat conductors 35, 36, 38 and 39 for control signals $S_1$ to $S_4$. A further semiconductor chip IC, which is arranged on the active upper face 20 of the power semiconductor chip 2, is connected via the bonding wires 29, 30 and 31 to the potential of the anode A of the parallel circuit 43 of small-area SiC power diodes $D_1$ to $D_8$, and is electrically connected by means of the bonding wire 24 to the source electrode S of the power semiconductor chip 2.

An integrated semiconductor component IC such as this is preferably arranged as a control circuit 19 and for temperature monitoring purposes on the active upper face 20 of the power semiconductor chip 2, with signal-current bonding connections 22 to 31 producing the connections for the surrounding semiconductor components of the semiconductor power module 1.

LIST OF REFERENCE SYMBOLS

1 Semiconductor power module
2 Power semiconductor chip or MOSFET
3 to 10 Upper face of SiC power diodes
11 Looped-through bonding connection
12 Looped-through bonding connection
13 Looped-through bonding connection
14 Metal layer or metal plate
15 Rows
16 Columns 17 Contact pad area
18 Inner flat conductor
19 Control circuit
20 Active upper face of the power semiconductor chip
21 High-current bonding connection
22 to 31 Signal-current bonding connections or bonding wires
32 Semiconductor power component housing or hollow housing
33 Metallic bottom plate
34 to 40 Metallic flat conductors
41 Detail of a semiconductor power module
42 Parallel connection (first embodiment)
43 Parallel connection (second embodiment)
44 Housing frame
45 Contact pads
A Anode
$A_1$ to $A_8$ Electrodes of the SiC power diode chips
D Drain electrode
$D_1$ to $D_8$ Small-area SiC power diode chips
$F_1$ to $F_8$ SiC power diode areas
$G_1$ Gate electrode
$G_2$ Gate electrode
IC Integrated semiconductor component
K Cathode
S Source electrode
$S_1$ to $S_4$ Flat conductors for control signals

The invention claimed is:

1. A semiconductor power module comprising at least one field effect power semiconductor chip and a plurality of fail-safe, small-area SiC power diodes connected in parallel and disposed within a housing frame, wherein the function of a large-area SiC power diode chip which is susceptible to failure is distributed over the small-area, parallel-connected SiC power diodes in such a way that total area of active SiC diode areas corresponds to an area of a large-area non-fail-safe SiC power diode chip,
wherein the small-area, parallel-connected SiC power diodes are arranged in rows and columns alongside one another, with one looped-through bonding wire in each row connecting electrodes on upper faces of the SiC power diode chips in one row, respectively and with a common looped-through bonding wire joining the bonding wires of the rows together along a column and connecting them directly, without any intervening electrodes, to a contact pad area of a flat conductor that passes through the housing frame.

2. The semiconductor power module according to claim 1, wherein electrodes on rear faces of the small-area SiC power chips are electrically connected to one another via a metallic layer, with the rear faces being electrically connected to the metallic layer via a diffusion solder.

3. The semiconductor power module according to claim 1, wherein the semiconductor power module has at least one further silicon-based semiconductor chip, which has an integrated control circuit.

4. The semiconductor power module according to claim 3, wherein the further silicon-based semiconductor chip is positioned on an active upper face of the field effect power semiconductor chip.

5. The semiconductor power module according to claim 3, wherein the further silicon-based semiconductor chip is configured to perform temperature monitoring for the field effect power semiconductor chip arranged underneath.

6. The semiconductor power module according to claim 1, wherein the small-area SiC power diodes and the bonding wires are arranged in the housing frame as a semiconductor power component housing, the housing frame being a metallic housing frame.

7. The semiconductor power module according to claim 1, wherein the small-area SiC power diodes and the bonding wires are arranged in the housing frame as a semiconductor power component housing, which is ceramic and has a metallic bottom coating and a covering plate.

8. The semiconductor power module according to claim 1, wherein the small-area SiC power diodes and the bonding wires are arranged in the housing frame as a semiconductor power component housing, the housing frame comprising a plastic housing compound and having a metallic bottom plate and metallic flat conductors which project out of the hollow housing.

9. A semiconductor power module comprising at least one field effect power semiconductor chip and a plurality of fail-safe, small-area SiC power diodes connected in parallel and disposed within a housing frame, wherein the function of a large-area SiC power diode chip which is susceptible to failure is distributed over the small-area, parallel-connected SiC power diodes in such a way that a total area of active SiC diode areas corresponds to an area of a large-area non-fail-safe SiC power diode chip, wherein the electrodes on upper faces of the small-area SiC power diodes are electrically connected to one another via looped-through bonding connections, and the electrodes on rear faces of the small-area SiC power chips are electrically connected to one another via a metallic layer, with the rear faces being electrically connected to the metallic layer via a diffusion solder,
wherein the small-area, parallel-connected SiC power diodes are arranged in rows and columns alongside one another, with one looped-through bonding wire in each row connecting electrodes on upper faces of the SiC power diode chips in one row, respectively and with a common looped-through bonding wire joining the bonding wires of the rows together along a column and connecting them directly, without any intervening electrodes, to a contact pad area of a flat conductor that passes through the housing frame.

10. A semiconductor power module comprising:
a housing frame;
a field effect power semiconductor chip disposed within the housing frame;
a flat conductor passing through the housing frame; and
a plurality of SiC power diodes connected in parallel and disposed within the housing frame, wherein the SiC power diodes are arranged in rows alongside one another, wherein in each of the rows a looped-through bonding wire connects electrodes of the SiC power diodes in that respective row, and wherein a common looped-through bonding wire joins the bonding wires of the rows together and connects them directly, without any intervening electrodes, to the flat conductor.

* * * * *